United States Patent
DiTommaso

(10) Patent No.: US 7,728,647 B2
(45) Date of Patent: Jun. 1, 2010

(54) TEMPERATURE COMPENSATION FOR RF DETECTORS

(75) Inventor: Vincenzo DiTommaso, Beaverton, OR (US)

(73) Assignee: Analog Devices, Inc., Norwood, MA (US)

( * ) Notice: Subject to any disclaimer, the term of this patent is extended or adjusted under 35 U.S.C. 154(b) by 125 days.

(21) Appl. No.: 12/175,362

(22) Filed: Jul. 17, 2008

(65) Prior Publication Data

US 2010/0013545 A1 Jan. 21, 2010

(51) Int. Cl.
*H01L 35/00* (2006.01)
(52) U.S. Cl. ...................... 327/513
(58) Field of Classification Search .......... 327/512, 327/513
See application file for complete search history.

(56) References Cited

U.S. PATENT DOCUMENTS 6,002,291 A 12/1999 Gilbert
6,430,403 B1 * 8/2002 Kossor ................ 455/126
7,180,359 B2 2/2007 DiTommaso
7,504,813 B2 * 3/2009 Manstretta .............. 323/312

OTHER PUBLICATIONS

Application Note AN-653: Improving Temperature, Stability and Linearity of High Dynamic Range RF Power Detectors, Eamon Nash, Analog Devices, Inc., Nov. 2003, pp. 1-8.
Translinear Circuits: An Historical Overview, Analog Integrated Circuits and Signal Processing, Barrie Gilbert, Kluwer Academic Publishers, 1996, pp. 95-118.
HMC610LP4E Data Sheet, Hittite Microwave Corporation, Jun. 2008, pp. 1-22.

* cited by examiner

*Primary Examiner*—Jeffrey S Zweizig
(74) *Attorney, Agent, or Firm*—Marger Johnson & McCollon, P.C.

(57) ABSTRACT

Compensation for an RF detector includes components having different order temperature functions. The components are combined and may be adjusted by various numbers of user-accessible terminals to provide individual adjustment for factors such as operating frequency. In some embodiments, first and second-order temperature functions are generated independently and combined to provide a polynomial function of temperature with coefficients that may be adjusted. In other embodiments, the outputs of the function generators may be more complex functions of temperature with various adjustable parameters.

22 Claims, 7 Drawing Sheets

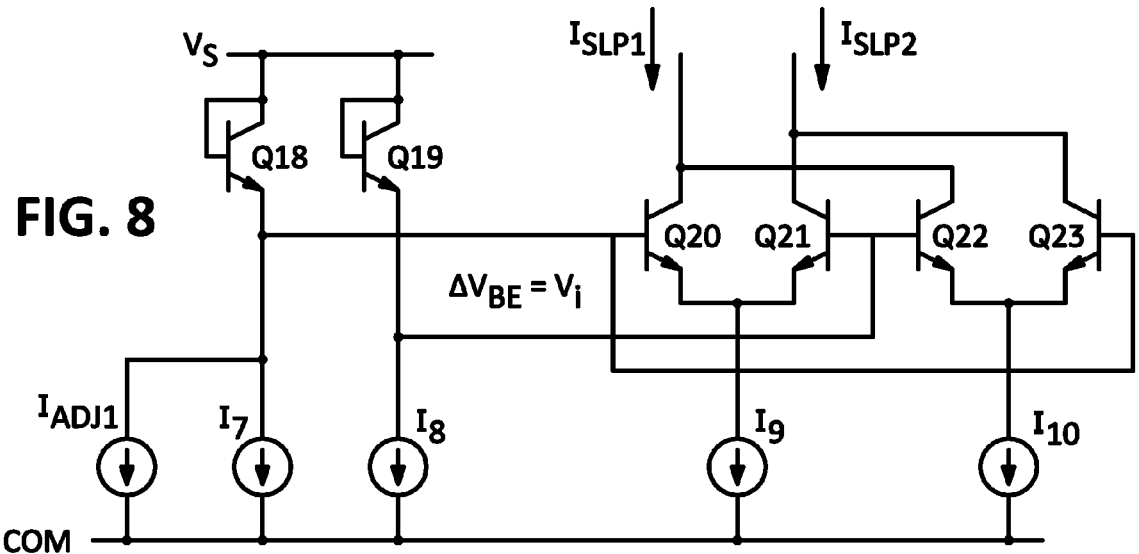
FIG. 8
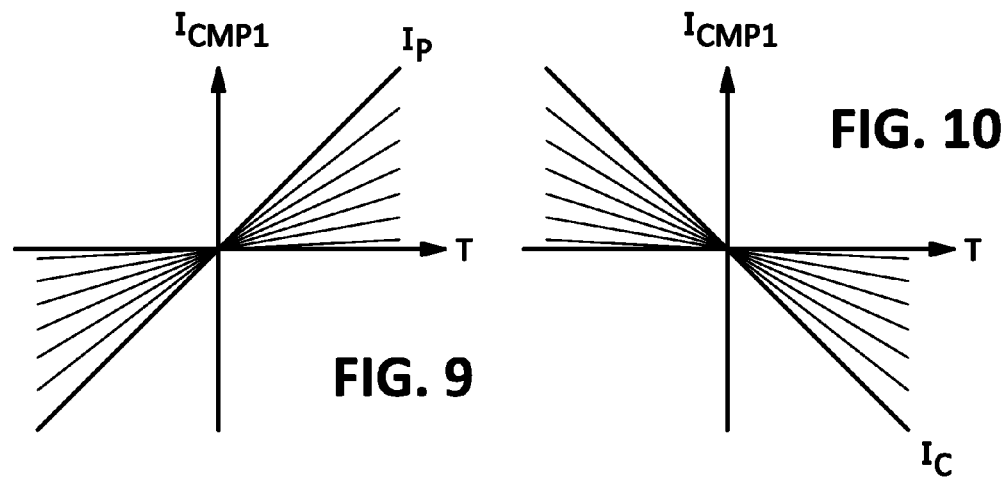
FIG. 10
FIG. 9
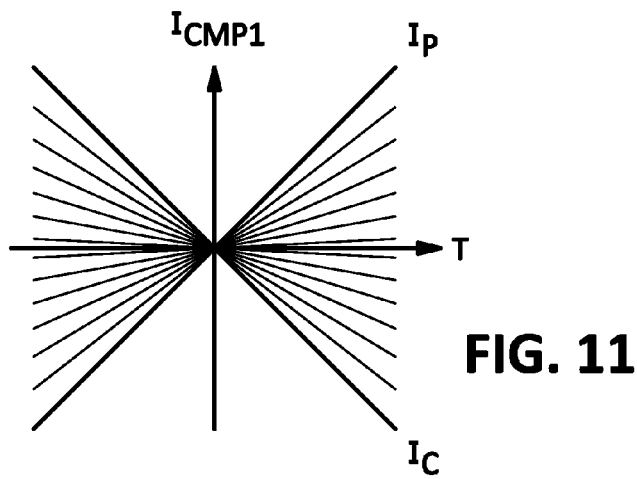
FIG. 11

TEMPERATURE COMPENSATION FOR RF DETECTORS

BACKGROUND

Advanced data encoding and modulation techniques have made it possible to transmit ever increasing amounts of information through radio frequency (RF) wireless communication systems. Accurate power measurement and control is critical to implementing these schemes. For example, code division multiple access (CDMA) systems rely on a coding scheme in which multiple users occupy the same part of the frequency spectrum, but to one user, signals from other users appear as noise. For such a system to work effectively, the transmitted power levels from individual handsets must be controlled so that the transmitted signals are received at the base station at about the same power level, regardless of how far each handset is from the base station. CDMA signals also have relatively high peak-to-average power ratios. These characteristics place extreme demands on the power measurement and control system.

Another transmission technique known as orthogonal frequency division multiplexing (OFDM) relies on multiple orthogonal subcarriers. Each subcarrier has a relatively low amplitude, but since numerous subcarriers occasionally add in phase to create very high instantaneous amplitudes, the resulting OFDM waveforms have very high peak-to-average power ratios.

Systems utilizing modulation schemes with high peak-to-average power ratios must often be operated in a condition known as "backoff" in which the output of the power amplifier is reduced to prevent distortion that occurs when the signal peaks exceed the linear range of the amplifier. Accurate power measurement is critical for implementing backoff control schemes.

Several different types of detectors are commonly used to measure the power of RF signals. They range from simple diode-detectors to more complex logarithmic amplifiers (log amps) and root-mean-square (RMS) detectors. The measurement characteristics of these detectors typically vary with temperature. For relatively low operating frequencies, the temperature dependencies of a detector can usually be corrected by a compensation signal having a relatively simple temperature function. As the operating frequency increases, however, the simple temperature functions become inadequate, and more complicated adjustments are required.

FIG. 1 illustrates a prior art temperature compensation circuit for an RF power detector. Currents $I_3$ and $I_4$ create voltage drops across the base-emitter junctions of diode-connected transistors Q3 and Q4. The difference between the base emitter voltages ($\Delta V_{BE}$) is applied as the input voltage Vi to a transconductance multiplier cell formed by Q1 and Q2. The $\Delta V_{BE}$ is multiplied by the tail current $I_5$ to produce a compensation signal $I_{OUT}$ which is taken as the difference between currents $I_1$ and $I_2$.

In one configuration, the circuit of FIG. 1 is arranged in combination with the circuit of FIG. 2 to provide a compensation signal having a logarithmic temperature function that can be used to temperature correct the output of a log amp. In this configuration, the current $I_3$ is made proportional to absolute temperature (PTAT), while $I_4$ and $I_5$ are implemented as temperature-stable currents (also referred to as ZTAT currents where the Z represents zero temperature coefficient). This particular combination of PTAT and ZTAT currents for $I_3$ and $I_4$ creates a $\Delta V_{BE}$ having the form $V_T \ln(I_P/I_Z)$. When this $\Delta V_{BE}$ is applied to Q1 and Q2, the resulting output has the form $I_{OUT}=I_5 \tan h[\ln(I_P/I_Z)]$ which can be approximated as $I_{OUT} \approx I_5 \ln(I_P/I_Z)$.

The circuit of FIG. 2 includes a user-accessible terminal ADJ to enable the user to vary the amount of tail current $I_5$, and thereby adjust the amount of temperature compensation based on the operating frequency. The reference voltage $V_{REF}$ is a temperature stable reference voltage, so the current through R3 is also temperature stable (ZTAT) and varies only with the value of $R_{ADJ}$ which the user connects to the terminal ADJ. Therefore, the tail current $I_5$ applied to the circuit of FIG. 1 varies only with the value of $R_{ADJ}$. The manufacturer typically provides a table of suggested values for $R_{ADJ}$ for various common operating frequencies. This type of temperature compensation scheme is further described in U.S. Pat. No. 7,180,359 which is by the same inventor as the present patent disclosure and is incorporated by reference.

In another configuration, the circuit of FIG. 1 is used in combination with the circuit of FIG. 3 and arranged to provide different types of temperature compensation as might be suitable for other types of detectors such as RMS detectors. For example, if $I_4$ is made complementary to absolute temperature (CTAT) rather than ZTAT, then the curvature of the $\Delta V_{BE}$ function is more pronounced than in the example above and provides a greater amount of adjustment. Additional shaping of the temperature function can be provided based on the form of the tail current $I_5$. For example, if $I_5$ is implemented as a PTAT current, the curvature of the $\Delta V_{BE}$ function is even more pronounced. Alternatively, however, the tail current $I_5$ can be made CTAT, ZTAT, or any other function of temperature.

As with the circuit of FIG. 2, the circuit of FIG. 3 also includes a user-accessible terminal ADJ to enable the user to vary the amount of tail current $I_5$, and thereby adjust the amount of temperature compensation based on the operating frequency. In this case, however, the temperature shape of the tail current $I_5$ is determined by the temperature shape of $I_6$. For example, if $I_6$ is PTAT, the tail current $I_5$ is also PTAT. By varying the voltage applied to ADJ terminal relative to the reference voltage $V_{REF}/2$, the amount of tail current applied to the multiplier can be adjusted to provide an approximation of the required temperature compensation for the specified operating frequency.

FIG. 4 illustrates another prior art circuit for providing temperature compensation to an RMS detector. The temperature dependency is provided by the junctions of Q8 and Q9. The currents through Q8 and Q9 pass through cascode transistors Q10 and Q11 and are then mirrored by current mirrors Q12,Q13 and Q14,Q15 to another mirror Q16,Q17. The difference current $I_{COMP}$ is used to affect the bias of the detector, for example by applying $I_{COMP}$ to a resistor ladder that is used in an interpolator for an RMS detector having a multiplicity of squaring cells. The user can adjust the compensation by connecting resistors Rcpa and Rcpb to user-accessible terminals CPA and CPB. Any difference between the currents Icpa and Icpb causes a negative or positive tilt in the temperature compensation. Trial-and-error techniques must be used to determine values of Rcpa and Rcpb that provide an approximation of the amount of temperature compensation required for any particular operating frequency.

BRIEF DESCRIPTION OF THE DRAWINGS

FIG. 8 illustrates an example embodiment showing some possible implementation details of a slope circuit according to some of the inventive principles of this patent disclosure.

FIGS. 9-11 illustrate the operation of the circuit of FIG. 8 for various combinations of temperature dependent tail currents.

DETAILED DESCRIPTION

Figure 1:
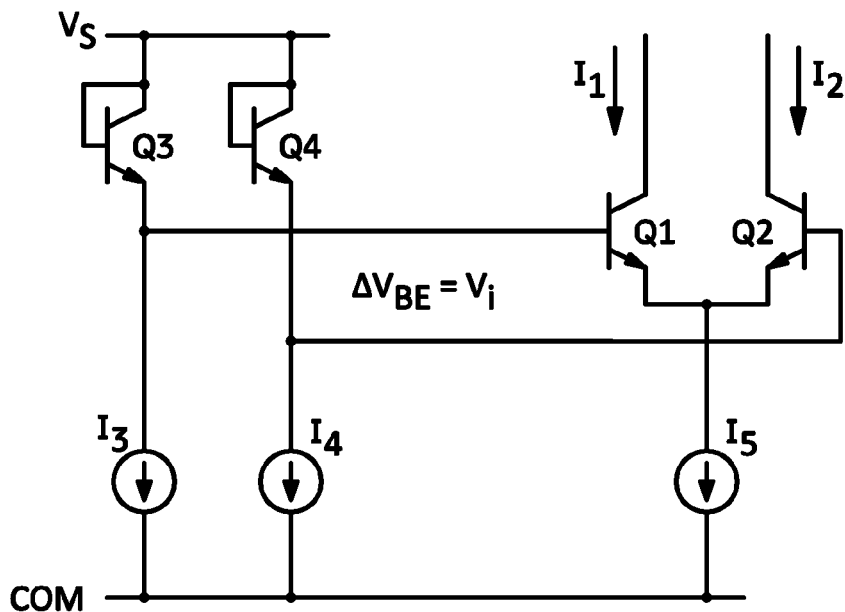
FIG. 1 illustrates a prior art temperature compensation circuit for an RF power detector.
Figure 2:
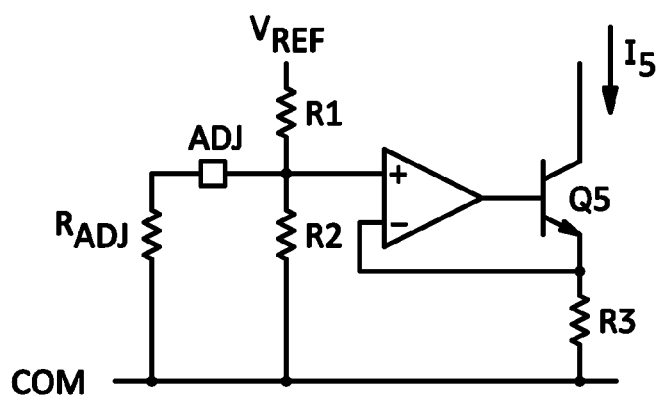
FIG. 2 illustrates a prior art circuit used to generate the tail current for the circuit of FIG. 1.
Figure 3:
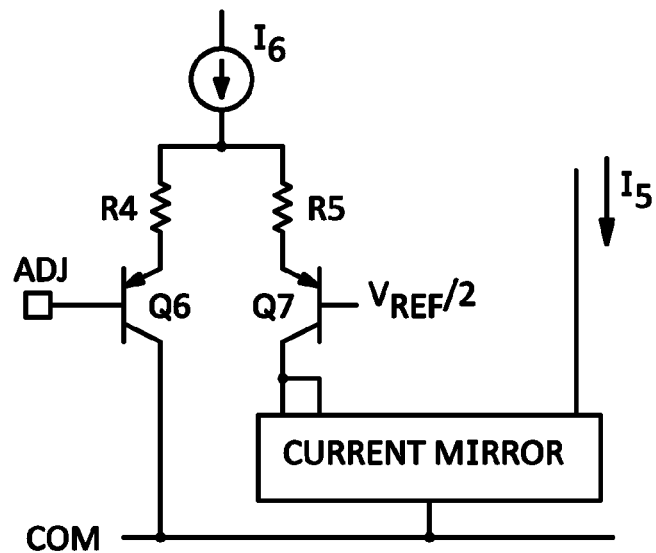
FIG. 3 illustrates another prior art circuit used to generate the tail current for the circuit of FIG. 1.
Figure 4:
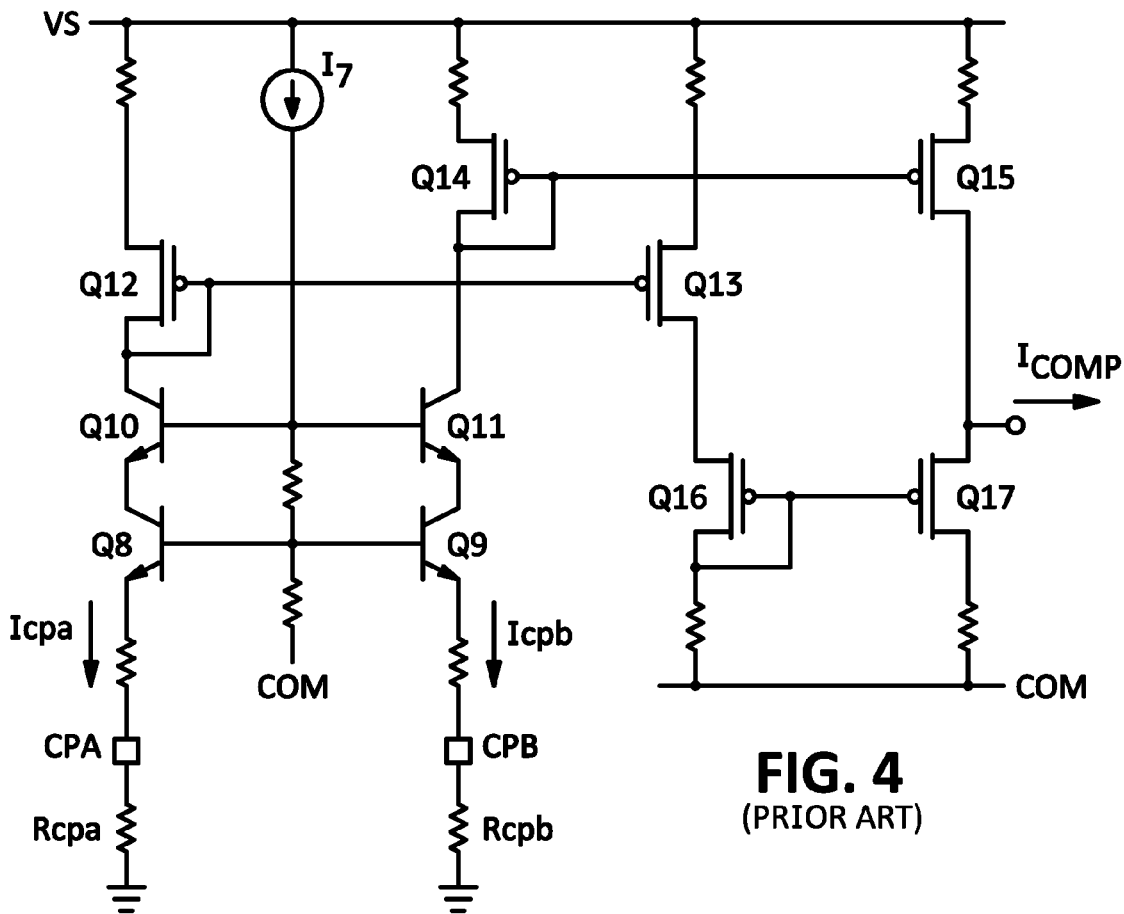
FIG. 4 illustrates another prior art temperature compensation circuit for an RF power detector.
Figure 5:
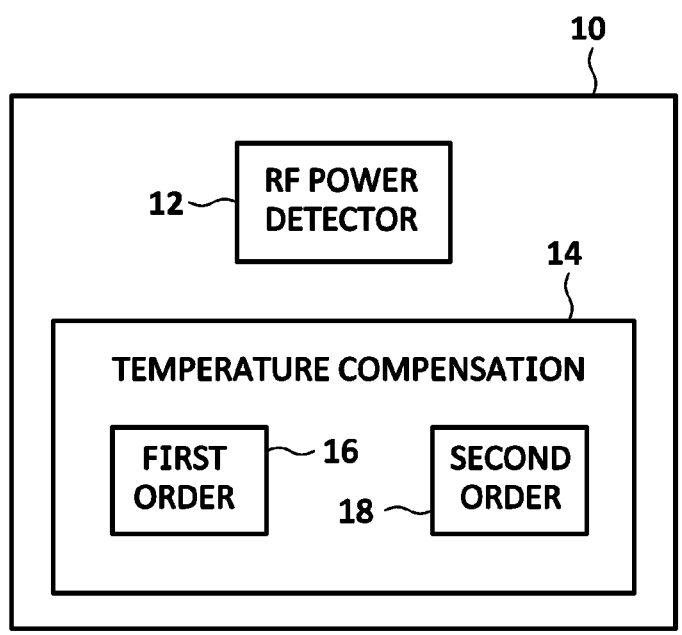
FIG. 5 illustrates an embodiment of a temperature compensation system for an RF power detector according to some of the inventive principles of this patent disclosure.

FIG. 5 illustrates an embodiment of a temperature compensation system for an RF power detector according to some of the inventive principles of this patent disclosure. In the embodiment of FIG. 5, an integrated circuit 10 includes an RF power detector 12 and a temperature compensation circuit 14 which provides temperature compensation to the detector. A first function generator 16 provides a first-order component to the temperature compensation, and a second function generator 18 provides a second-order component to the temperature compensation. The two components may be independently adjusted.

One approach to implementing the system of FIG. 5 according to some of the inventive principles of this patent disclosure involves identifying the temperature characteristics of a specific detector over a range of operating frequencies, and implementing the function generators to create an approximation of the specific frequency/temperature characteristics of the detector. The approximation includes components from both of the function generators. In this context, the order of the function generator refers to the relative degree of precision (or complexity) the component adds to the approximation. For example, with a zeroth-order approximation, a simple function is utilized (in some embodiments this can be as simple as a constant) to provide a rough order of magnitude approximation. With a first order approximation, a more complex function is utilized to provide a more refined fit to the actual frequency/temperature characteristics of the detector. Higher order approximations involve the use of temperature functions of progressively greater complexity and refinement.

Although first and second-order function generators are shown in the embodiment of FIG. 5, the inventive principles are not limited to these specific details. For example, any combination of two or more generators having any orders (e.g., 0th, 1st, 2nd, etc.) can be used. The system may be arranged to enable the user to adjust the functions themselves, or to adjust the relative amount of the component that each function provides to the overall approximation.

Another approach to implementing the system of FIG. 5 according to some of the inventive principles of this patent disclosure involves implementing the function generators as predefined functions and enabling the user to adjust the relative amount of the component that each function provides through trial-and-error or look-up table.

Figure 6:
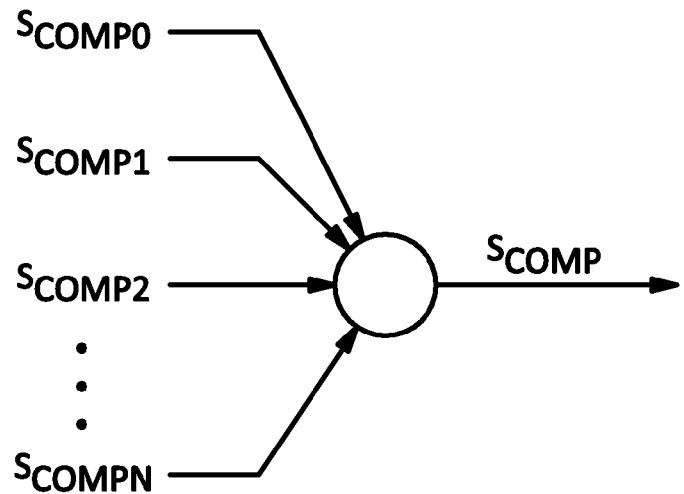
FIG. 6 illustrates another embodiment of a temperature compensation system for an RF power detector according to some of the inventive principles of this patent disclosure.

FIG. 6 illustrates another embodiment of a temperature compensation system according to some of the inventive principles of this patent disclosure. In the embodiment of FIG. 6, individual temperature compensation signals $S_{CMP0}$, $S_{CMP1}$, $S_{CMP2}$ ... $S_{CMPN}$ are generated separately and combined to create a combined compensation signal $S_{COMP}$ which can be used to provide temperature compensation to a detector. Each of the individual temperature compensation signals has a corresponding order. For example the signal $S_{CMP1}$, may have a first order temperature function, $S_{CMP2}$ may have a second order temperature function, etc.

In one example embodiment, the individual temperature compensation signals may include terms that combine to form a polynomial. For example, the combined compensation signal may have the following form:

$$S_{COMP} = A_0 + A_1 T + A_2 T^2 + \ldots + A_N T^N \quad \text{(Eq. 1)}$$

where T is temperature (in °K) and $A_0$, $A_1$ and $A_2$ are coefficients, any or all of which can be made adjustable by the user. Thus, the compensation signal has a constant component $A_0$, a linear component $A_1 T$ and a nonlinear (or quadratic) component $A_2 T^2$.

In another example embodiment, the individual terms may themselves be more complex functions of temperature:

$$S_{COMP} = f_1(T) + f_2(T) + f_3(T) + \ldots + f_N(T) \quad \text{(Eq. 2)}$$

where the functions $f_1(T)$, $f_2(T)$ and $f_3(T)$ are progressively higher order functions of temperature. For example, the functions may themselves be polynomials, or then can be transcendental functions such as exponentials, logarithms, etc. As with the embodiment of Eq. 1, any or all of the terms can also include a coefficient that can be made adjustable by the user.

Figure 7:
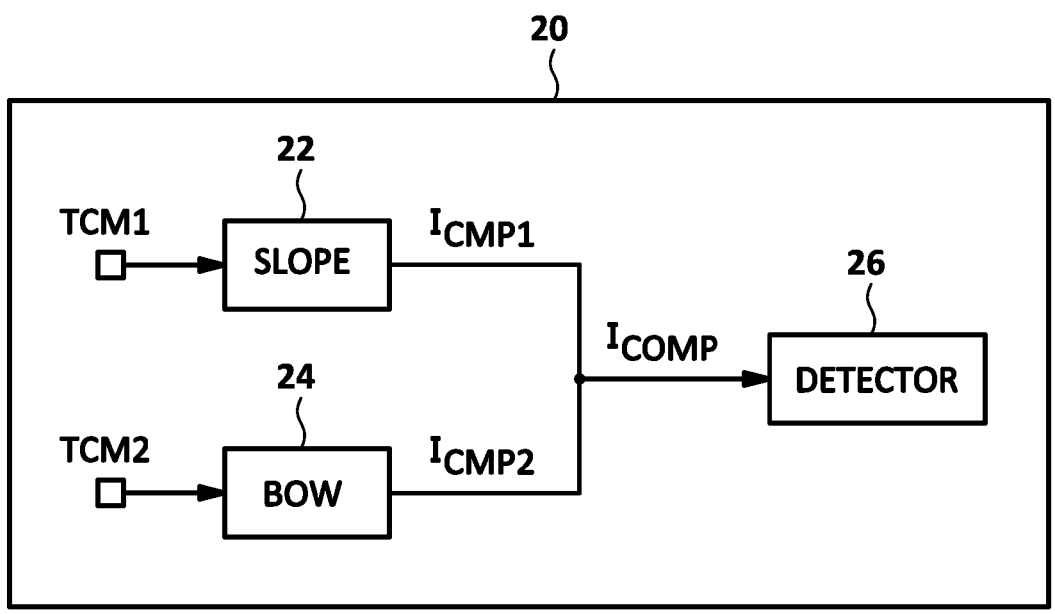
FIG. 7 illustrates another embodiment of a temperature compensation system for an RF power detector according to some of the inventive principles of this patent disclosure.

FIG. 7 illustrates another embodiment of a temperature compensation system for an RF power detector according to some of the inventive principles of this patent disclosure. An integrated circuit 20 includes a slope circuit 22 to generate a first compensation signal $I_{CMP1}$ which varies linearly with temperature, and a bow circuit 24 to generate a second compensation signal $I_{CMP2}$ which varies with the square of temperature. The two individual compensation signals are combined to create a final compensation signal $I_{COMP}$ which is applied to the detector 26. User accessible terminals TCM1 and TCM2 enable the user to adjust the contributions of the $I_{CMP1}$ and $I_{CMP2}$ components to $I_{COMP}$, respectively.

FIG. 8 illustrates an example embodiment showing some possible implementation details of the slope circuit 22 of FIG. 7 according to some of the inventive principles of this patent disclosure. Referring to FIG. 8, diode connected transistors Q18 and Q19 are biased by currents $I_7$ and $I_8$, respectively. The $\Delta V_{BE}$ developed across Q18 and Q19 is applied to the inputs of dual multiplier cells Q20,Q21 and Q22,Q23, which are biased by tail currents $I_9$ and $I_{10}$, respectively. An adjustment current $I_{ADJ1}$ enables the user to adjust the relative contribution from the two multipliers which have their outputs connected together. The slope compensation signal is taken as the difference between the currents $I_{SLP1}$ and $I_{SLP2}$. Alternatively, the output may be made single-ended.

In one embodiment, the currents $I_7$ and $I_8$ are ZTAT currents. Thus, the diode connected transistors Q18 and Q19 do not contribute to the temperature function and serve merely as pre-distortion diodes so that multiplier cells Q20,Q21 and Q22,Q23 operate as pure multipliers to determine the relative amounts of $I_9$ and $I_{10}$ that are provided to the outputs. The choice of temperature function selected for $I_9$ and $I_{10}$ determine the direction and extent of the sloping temperature compensation provided by the circuit. For example, if one of the currents is made PTAT and the other is made ZTAT, the circuit provides a range of linear sloping outputs as shown in FIG. 9 where amount of slope is determined by the value of $I_{ADJ1}$. That is, as the value of $I_{ADJ1}$ is swept through its range, the tilt of the output function rotates from a position flat on the horizontal axis to the maximum value shown by the line $I_P$.

If one of $I_9$ and $I_{10}$ is made CTAT and the other is made ZTAT, the circuit provides a range of slopes in the opposite direction as shown in FIG. 10. If additional, bi-directional adjustment range is needed, the tail currents can be made PTAT and CTAT with the resulting full range of negative and positive tilt shown in FIG. 11.

Figure 12:
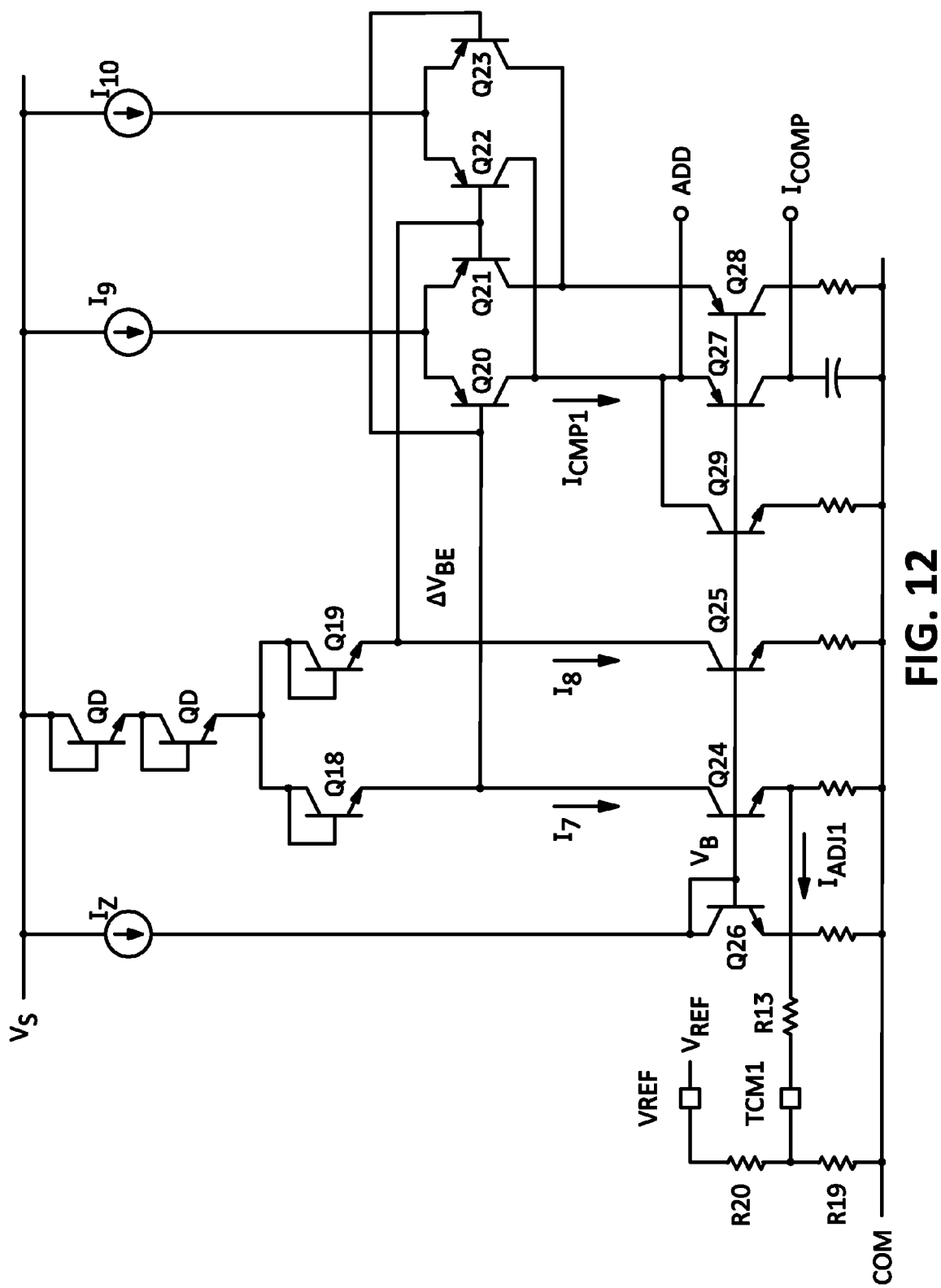
FIG. 12 illustrates another example embodiment showing some possible implementation details of a slope circuit according to some of the inventive principles of this patent disclosure.

FIG. 12 illustrates another example embodiment showing some possible implementation details of the slope circuit 22 of FIG. 7 according to some of the inventive principles of this patent disclosure. The embodiment of FIG. 12 is similar to that of FIG. 8, but the multiplier cores are implemented with PNP transistors. A bias voltage generator including Q26 is arranged to generate a bias voltage $V_B$ to establish currents $I_7$ and $I_8$ in Q24 and Q25. The bias voltage $V_B$ also serves as an anchor for cascode transistors Q27 and Q28. If $I_7$ and $I_8$ have the same temperature function, the diode connected transistors Q18 and Q19 do not contribute to the temperature function of the compensation signal and serve merely as pre-distortion diodes so that multiplier cells Q20,Q21 and Q22, Q23 operate as pure multipliers to determine the relative amounts of $I_9$ and $I_{10}$ that are provided to the outputs. The currents $I_7$ and $I_8$ are preferably made ZTAT as this simplifies the interface for the user adjustment, $I_7$ and $I_8$ can be made CTAT, PTAT or any other function of temperature.

The adjustment current $I_{ADJ1}$ is applied to the emitter terminal of Q24 through R13 which is connected to user-accessible terminal TCM1. A reference voltage $V_{REF}$ which is generated on the integrated circuit can be brought out to another user-accessible terminal VREF to provide a convenient voltage source to drive a voltage divider including R19 and R20 for creating the adjustment current.

The output of the slope circuit $I_{CMP1}$ is taken from the collectors of Q20 and Q22. The node ADD at the output of the multipliers provides a convenient summing node for adding the nonlinear compensation current $I_{CMP2}$ from a bow circuit as described below. The final combined output signal $I_{COMP}$ can then be taken from the other side of cascode transistor Q27. Transistor Q29 may be included to provide an additional offset to the output of the slope circuit.

Figure 13:
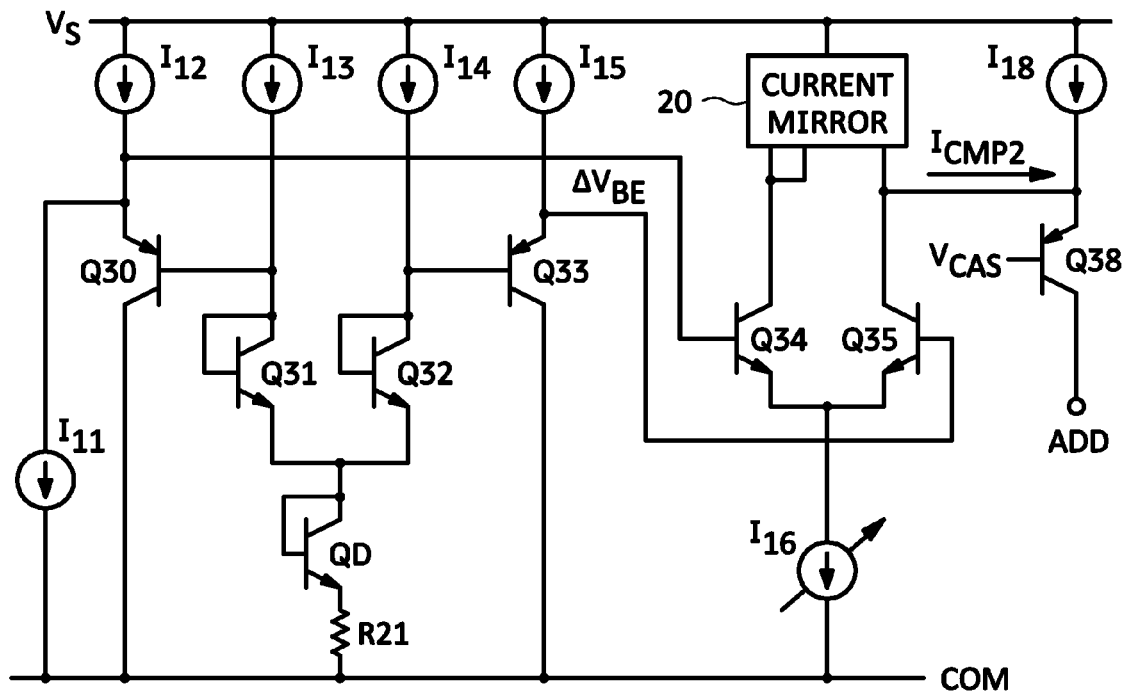
FIG. 13 illustrates an example embodiment showing some possible implementation details of a bow circuit according to some of the inventive principles of this patent disclosure.

FIG. 13 illustrates an example embodiment showing some possible implementation details of the bow circuit 22 of FIG. 7 according to some of the inventive principles of this patent disclosure. Referring to FIG. 13, the junctions that provide the $\Delta V_{BE}$ input to the multiplier cell are arranged in stacks to generate second order functions, thus providing a temperature function with bow (or curvature). In this example, $I_{11}$ and $I_{13}$ are made PTAT, while $I_{14}$ and $I_{15}$ are made ZTAT. The currents are all scaled to have equal values (unit of current) at some predetermined temperature, e.g., 300° K, except that $I_{12}$ is scaled twice as large (made with two units). Current $I_{11}$ subtracts a PTAT current from the ZTAT current of $I_{12}$ to produce a CTAT current in Q30. Transistor Q31 is biased with a PTAT current, and Q33 and Q32 are both biased by ZTAT currents. Diode connected transistor QD and R21 elevate the common emitter node of Q31 and Q32 above common COM.

The base-emitter voltages $V_{BE}$ of Q30, Q31, Q32 and Q33 are as follows:

$$V_{BE30} = V_T \ln\left(\frac{I_C}{I_S}\right) \qquad (\text{Eq. 3})$$

$$V_{BE31} = V_T \ln\left(\frac{I_P}{I_S}\right) \qquad (\text{Eq. 4})$$

$$V_{BE32} = V_T \ln\left(\frac{I_Z}{I_S}\right) \qquad (\text{Eq. 5})$$

$$V_{BE33} = V_T \ln\left(\frac{I_Z}{I_S}\right) \qquad (\text{Eq. 6})$$

where $V_T$ is the thermal voltage kT/q, and $I_S$ is the saturation current for a bipolar junction transistor (BJT). The $\Delta V_{BE}$ across the emitters of Q30 and Q32 is:

$$\Delta V_{BE} = V_{BE30} + V_{BE31} V_{BE32} - V_{BE33} \qquad (\text{Eq. 7})$$

Substituting Eqs. 3-6 into Eq. 7 and rearranging provides:

$$\Delta V_{BE} = V_T \ln\left(\frac{I_C}{I_S}\right) + V_T \ln\left(\frac{I_P}{I_S}\right) - V_T \ln\left(\frac{I_Z}{I_S}\right) - V_T \ln\left(\frac{I_Z}{I_S}\right) \qquad (\text{Eq. 8})$$

$$\Delta V_{BE} = V_T \ln\left(\frac{I_C I_P}{I_Z^2}\right) \qquad (\text{Eq. 9})$$

Substituting $I_C = 2I_Z - I_P$ yields:

$$\Delta V_{BE} = V_T \ln\left(\frac{2I_Z I_P - I_P^2}{I_Z^2}\right) \qquad (\text{Eq. 10})$$

The $\Delta V_{BE}$ is applied as the input Vi to the transconductance (gm) multiplier cell Q34,Q35 which is biased by an adjustable tail current $I_{16}$. The transfer function of a generic gm cell has a hyperbolic tangent (tanh) form which may be stated a follows:

$$I_{OUT} = I_T \tanh\left(\frac{V_i}{2V_T}\right) \qquad (\text{Eq. 11})$$

where $I_T$ is the bias or "tail" current through the gm cell and $V_i$ is the differential input voltage. If Eq. 10 is substituted into Eq. 11, the $V_T$s cancel and the result is:

$$I_{OUT} = I_{16} \tanh\left(\frac{\ln[(2I_Z I_P - I_P^2)/I_Z^2]}{2}\right) \qquad (\text{Eq. 12})$$

If the input signal to the gm cell is kept relatively small, the tanh function may be approximated as simply the operand itself:

$$I_{OUT} \approx I_{16}\left(\frac{\ln[(2I_Z I_P - I_P^2)/I_Z^2]}{2}\right) \quad \text{(Eq. 13)}$$

In this example, the PTAT and ZTAT currents are scaled with equal units, so the magnitude of $I_Z$ is roughly equal to the magnitude of $I_P$, and therefore, the operand of the ln function is always close to one. However, if the operand of a natural logarithmic function is close to one, the function may be approximated as simply the operand itself, minus one (i.e., $\ln(a) \approx a-1$ when $a \approx 1$). Therefore:

$$I_{OUT} \approx I_{16}\left(\frac{(2I_Z I_P - I_P^2)/I_Z^2 - 1}{2}\right) \quad \text{(Eq. 14)}$$

From Eq. 14 it is apparent that the output has a second order temperature dependency due to the $-I_P^2$ term. The multiplier cell Q34,Q35 is loaded by a current mirror 28, and the output compensation current $I_{CMP2}$ is taken as the difference of the collector currents in Q34 and Q35.

Figure 14:
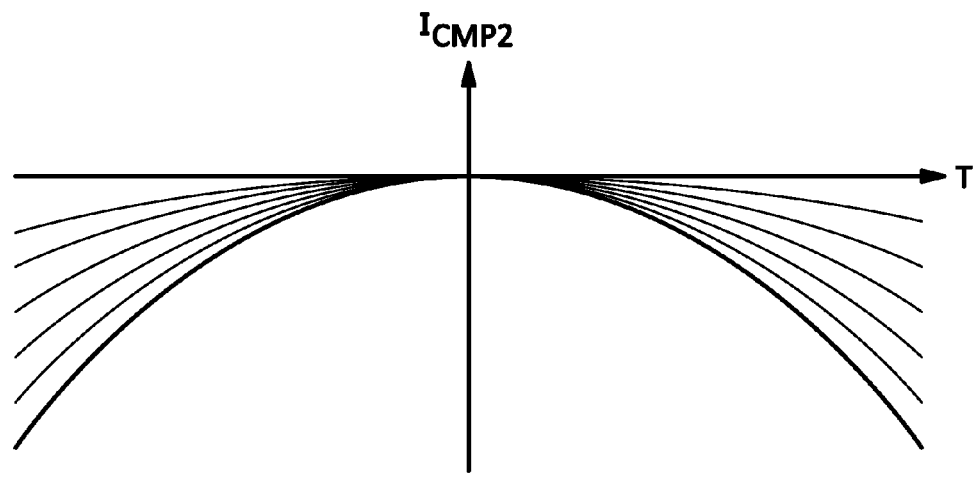
FIG. 14 illustrates the operation of the circuit of FIG. 13 for various amounts of adjustment.

The amount (or weighting) of the output from the bow circuit of FIG. 13 can be adjusted by adjusting the tail current $I_{16}$ to provide a range of outputs as shown in FIG. 14.

To provide a zeroth-order offset, a ZTAT current $I_{18}$ can be added to $I_{CMP2}$. This combined "bow plus offset" current can be applied to the ADD terminal of FIG. 9 through a cascode transistor Q38 to provide the combined temperature compensation signal $I_{COMP}$ as discussed above.

In other embodiments, the multiplicity of junctions and temperature shaped bias currents may be configured in other arrangements to provide any other suitable function of temperature. Moreover, the multiplicity can be arranged to provide temperature functions of any order. In the example of FIG. 13, the junctions are arranged in stacks of two to provide second-order functions. But they can also be arranged in stacks of three to provide third-order functions, and so on, or they can be mixed to provide other functions.

Figure 15:
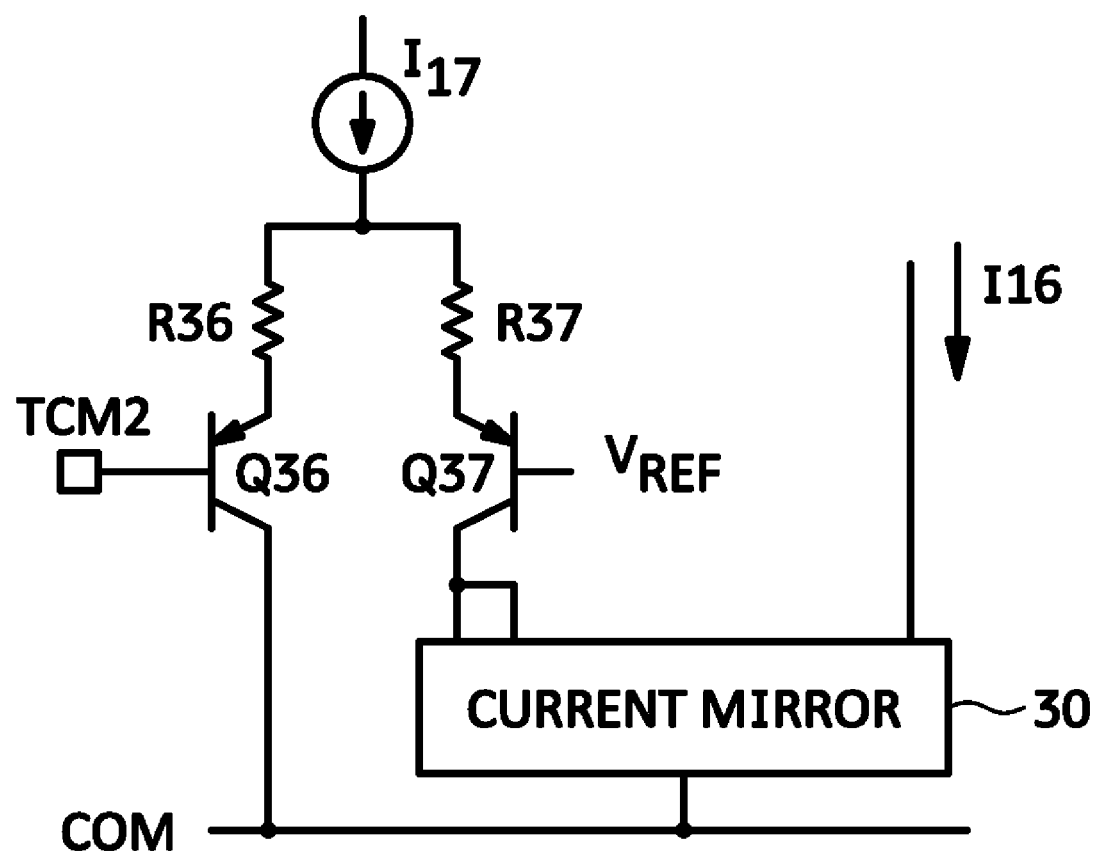
FIG. 15 illustrates an example embodiment of a circuit for providing adjustable tail current according to some of the inventive principles of this patent disclosure.

FIG. 15 illustrates an example embodiment of a circuit for providing the adjustable tail current $I_{16}$ to the bow circuit of FIG. 13 according to some of the inventive principles of this patent disclosure. A user-applied adjustment voltage on the terminal TCM2 is compared to a reference voltage $V_{REF}$ by a differential pair of transistors Q36,Q37 which splits a tail current $I_{17}$ between a power supply common COM, and a current mirror 30. The current mirror provides the adjustable tail current $I_{16}$ to the multiplier of FIG. 13. If $I_{17}$ is made ZTAT, no additional temperature shaping is provided $I_{16}$, and the temperature shaping of the output current $I_{CMP2}$ of the bow circuit is determined solely by the $\Delta V_{BE}$ applied to the Vi input of the multiplier. Alternatively, the current $I_{17}$ can be a temperature dependent current (e.g., PTAT or CTAT) to provide additional temperature shaping.

Referring again to FIG. 7, when the slope and bow circuits are implemented as shown in the examples above and their outputs are combined to generate the final compensation signal $I_{COMP}$, the resulting system provides highly flexible and customizable compensation that can be adjusted by the user to provide an accurate approximation of the temperature and frequency characteristics of the detector. The user-accessible terminals enable the user to create a composite compensation signal having any suitable amounts of the temperature shapes shown in FIGS. 9-11 and 14.

The inventive principles of this patent disclosure have been described above with reference to some specific example embodiments, but these embodiments can be modified in arrangement and detail without departing from the inventive concepts. For example, the embodiments described above with respect to FIGS. 5 and 7-16 have been shown in the context of a system having two function generators (one first order and another second order) and two user accessible terminals. As is apparent from FIG. 6, however, the inventive principles of this patent disclosure enable the creation of compensation systems involving the generation of any number of temperature functions of any varying orders, and any number of user accessible terminals. For example, the embodiment of FIG. 5 may be implemented with only one terminal to adjust one of the functions. Or the embodiment of FIG. 13 may be provided with another user-accessible terminal to adjust $I_{18}$. Other embodiments may include third-order, fourth-order, etc. function generators, alone or in combination with additional zeroth, first and second-order generators, and any number of user-accessible terminals may be provided to adjust whichever functions are beneficial to adjust. A temperature function of a certain order may also include components of lower order functions. For example, the function generated by the embodiment of FIG. 13 is a second-order function even though it includes first and zeroth-order components.

A user-accessible terminal can be accessed by whatever technique would normally be used by a user of the device. Thus, if the product is sold as a die, the user-accessible terminals may be bond-pads like any of the other terminals. If the die is packaged, a user accessible terminal may be a pin, lead or other type of contact like any of the other terminals on the package.

A compensation signal according to the inventive principles of this patent disclosure can be applied to the detector in any suitable manner. For example, the combined compensation signal $I_{COMP}$ shown in FIG. 12 can be added into the setpoint interface of an RMS detector through a resistive, or it can be added to the output of a log amp through one or more summing nodes. The compensation circuit can be separate from, or integral with, the detector. The compensation circuit may be fabricated on a separate integrated circuit from the detector and packaged in a separate package or in the same package as the detector, or mounted on the same header as the detector. An adjustment signal may be applied to a compensation circuit only to vary the amount of compensation, or the adjustment may contribute additional functionality to the compensation, as for example, if the adjustment signal is a PTAT or CTAT signal.

As further examples, some transistors have been illustrated as bipolar junction transistors (BJTs) of specific polarities, but MOS and other types and polarities of devices may be used as well. Thus, the terms base, emitter and collector are understood to refer to the corresponding terminals of other types of transistors. Likewise, in FIG. 8, currents $I_7$ and $I_8$, can be implemented as PTAT, CTAT or other temperature dependent currents to provide additional temperature shaping.

Since the embodiments described above can be modified in arrangement and detail without departing from the inventive concepts, such changes and modifications are considered to fall within the scope of the following claims.

The invention claimed is:

1. An integrated circuit comprising:
    an RF power detector having an input to receive an RF signal and an output to provide a signal representative of the power of the RF signal;

a temperature compensation circuit coupled to the RF power detector to provide temperature compensation to the RF power detector;

a first user-accessible terminal to adjust a first component of the temperature compensation; and a second user-accessible terminal to adjust a second component of the temperature compensation;

wherein the first and second components are of different orders.

2. The integrated circuit of claim 1 wherein:
the first component of the temperature compensation comprises a first-order component; and
the second component of the temperature compensation comprises a second-order component.

3. The integrated circuit of claim 2 wherein:
the first-order component comprises a linear component; and
the second-order component comprises a quadratic component.

4. The integrated circuit of claim 1 wherein the first and second components may be adjusted independently.

5. A system comprising:
an RF power detector having an input to receive an RF signal and an output to provide a signal representative of the power of the RF signal; and
a temperature compensation circuit coupled to the RF power detector to provide temperature compensation to the RF power detector, wherein the temperature compensation circuit comprises:
a first function generator to generate a first compensation signal having a first temperature function; and
a second function generator to generate a second compensation signal having a second temperature function having a different order than the first temperature function.

6. The system of claim 5 further comprising a first user-accessible terminal to enable to adjust the first component of the temperature compensation.

7. The system of claim 6 further comprising a second user-accessible terminal to enable to adjust the second component of the temperature compensation.

8. The system of claim 5 wherein the first function generator comprises:
a $\Delta V_{BE}$ cell to generate a $\Delta V_{BE}$ signal; and
a first multiplier to multiply the $\Delta V_{BE}$ signal by a first temperature dependent signal.

9. The system of claim 8 wherein the first function generator further comprises a second multiplier to multiply the $\Delta V_{BE}$ signal by a second temperature dependent signal.

10. The system of claim 5 wherein each of the first and second temperature dependent signals comprise one of a PTAT, ZTAT or CTAT signal.

11. The system of claim 5 wherein the detector and compensation circuit are fabricated on the same integrated circuit.

12. The system of claim 5 wherein the detector and compensation circuit are fabricated on the different integrated circuits.

13. The system of claim 5 wherein the second function generator comprises:
a $\Delta V_{BE}$ cell to generate a $\Delta V_{BE}$ signal having a second-order temperature dependency; and
a multiplier to multiply the $\Delta V_{BE}$ signal by an adjustment signal.

14. A method of temperature compensating an RF detector comprising:
generating a first temperature compensation signal;
generating a second temperature compensation signal having a different order than the first temperature compensation signal;
combining the first and second temperature compensation signals to generate a combined temperature compensation signal; and
applying the combined temperature compensation signal to the RF power detector.

15. The method of claim 14 further comprising independently adjusting the first and second temperature compensation signals.

16. The method of claim 14 further comprising:
generating a third temperature compensation signal; and
combining the third temperature compensation signal with the first and second temperature compensation signals to generate the combined temperature compensation signal.

17. The method of claim 14 wherein:
the first temperature compensation signal comprises a first-order component; and
the second temperature compensation signal comprises a second-order component.

18. The method of claim 17 wherein the first-order component comprises a linear component.

19. The method of claim 18 wherein the second-order component comprises a quadratic component.

20. The method of claim 19 wherein the second-order component comprises a transcendental component.

21. The method of claim 14 where the combined temperature compensation signal has the form $S_{COMP}=A_0+A_1T+A_2T^2A+\ldots+A_NT^N$ where T represents temperature.

22. The method of claim 14 where the combined temperature compensation signal has the form $S_{COMP}=f_1(T)+f_2(T)+f_2(T)+\ldots+f_N(T)$ where T represents temperature.

* * * * *